United States Patent
Iwai et al.

(10) Patent No.: US 11,473,212 B2
(45) Date of Patent: Oct. 18, 2022

(54) GROUP 13 (III) NITRIDE THICK LAYER FORMED ON AN UNDERLYING LAYER HAVING HIGH AND LOW CARRIER CONCENTRATION REGIONS WITH DIFFERENT DEFECT DENSITIES

(71) Applicant: NGK INSULATORS, LTD., Nagoya (JP)

(72) Inventors: Makoto Iwai, Kasugai (JP); Takashi Yoshino, Ama (JP)

(73) Assignee: NGK INSULATORS, LTD., Aichi (JP)

( * ) Notice: Subject to any disclaimer, the term of this patent is extended or adjusted under 35 U.S.C. 154(b) by 425 days.

(21) Appl. No.: 15/991,317

(22) Filed: May 29, 2018

(65) Prior Publication Data

US 2018/0274128 A1  Sep. 27, 2018
US 2019/0360119 A9  Nov. 28, 2019

Related U.S. Application Data

(63) Continuation of application No. PCT/JP2016/075175, filed on Aug. 29, 2016.

(30) Foreign Application Priority Data

Dec. 11, 2015 (JP) .............................. JP2015-242068

(51) Int. Cl.
*H01L 33/32* (2010.01)
*C30B 29/38* (2006.01)
(Continued)

(52) U.S. Cl.
CPC .............. *C30B 29/38* (2013.01); *C30B 19/02* (2013.01); *C30B 19/12* (2013.01); *C30B 25/183* (2013.01);
(Continued)

(58) Field of Classification Search
CPC ..... C30B 29/38; C30B 29/406; H01L 21/205; H01L 21/208
See application file for complete search history.

(56) References Cited

U.S. PATENT DOCUMENTS

| | | |
|---|---|---|
| 2002/0197825 A1 | 12/2002 | Usui et al. |
| 2003/0145783 A1 | 8/2003 | Motoki et al. |
| 2006/0202188 A1 | 9/2006 | Ueta et al. |
| 2006/0270200 A1 | 11/2006 | Shibata |

FOREIGN PATENT DOCUMENTS

| | | |
|---|---|---|
| JP | 3631724 B2 | 6/2003 |
| JP | 3801125 B2 | 7/2003 |

(Continued)

OTHER PUBLICATIONS

German Office Action for corresponding application No. 11 2016 005 626.5, dated Feb. 21, 2019, including partal English: translation (9 pages).

(Continued)

*Primary Examiner* — Anh D Mai
(74) *Attorney, Agent, or Firm* — Flynn Thiel, P.C.

(57) ABSTRACT

A crystal substrate 1 includes an underlying layer 2 and a thick film 3. The underlying layer 2 is composed of a crystal of a nitride of a group 13 element and includes a first main face 2a and a second main face 2b. The thick film 3 is composed of a crystal of a nitride of a group 13 element and provided over the first main face of the underlying layer. The underlying layer 2 includes a low carrier concentration region 5 and a high carrier concentration region 4 both extending between the first main face 2a and the second main face 2b.

10 Claims, 4 Drawing Sheets

(51) Int. Cl.
- *C30B 25/18* (2006.01)
- *H01L 21/02* (2006.01)
- *C30B 19/12* (2006.01)
- *C30B 19/02* (2006.01)
- *H01L 21/205* (2006.01)
- *H01L 21/208* (2006.01)
- *C30B 29/40* (2006.01)
- *H01L 33/00* (2010.01)

(52) U.S. Cl.
CPC ........ *C30B 29/406* (2013.01); *H01L 21/0242* (2013.01); *H01L 21/0254* (2013.01); *H01L 21/0262* (2013.01); *H01L 21/02458* (2013.01); *H01L 21/02494* (2013.01); *H01L 21/02505* (2013.01); *H01L 21/205* (2013.01); *H01L 21/208* (2013.01); *H01L 33/32* (2013.01); *H01L 21/02573* (2013.01); *H01L 33/0075* (2013.01)

(56) References Cited

FOREIGN PATENT DOCUMENTS

| | | |
|---|---|---|
| JP | 4396816 B2 | 5/2005 |
| JP | 2008-060519 | 3/2008 |
| JP | 2009-012986 A | 1/2009 |
| JP | 2010-070430 A | 4/2010 |
| JP | 2014-088272 A | 5/2014 |
| WO | WO 2013/058352 A1 | 4/2013 |

OTHER PUBLICATIONS

International Search Report from corresponding PCT/JP2016/075175 (2 pages).
*Development of GaN Substrates*, by Kensaku Motoki, SEI Technical Review 2009, July, vol. 175, pp. 10-18.
International Preliminary Report on Patentability for PCT/JP2016/075175, dated Jun. 12, 2018 (1 pg.).
English translation of Written Opinion of the International Searching Authority for PCT/JP2016/075175, dated Sep. 27, 2016 (4 pgs.).

GROUP 13 (III) NITRIDE THICK LAYER FORMED ON AN UNDERLYING LAYER HAVING HIGH AND LOW CARRIER CONCENTRATION REGIONS WITH DIFFERENT DEFECT DENSITIES

CROSS-REFERENCE TO RELATED APPLICATIONS

This is a continuation of International Application No. PCT/JP2016/075175, filed Aug. 29, 2016, which claims the priority of Japanese Patent Application No. 2015-242068, filed Dec. 11, 2015, the entire contents of which are incorporated herein by reference.

TECHNICAL FIELD

The present invention relates to a substrate of a crystal of a group 13 nitride and a functional device utilizing the same. For example, the present invention may be used in technical fields requiring a high quality, such as a blue LED with an improved color rendering index and is expected to serve as a future substitute of a luminescent lamp, a blue-violet laser for high-speed and high-density optical memory, a power device for an inverter for a hybrid car or the like.

RELATED ART STATEMENT

As white LED's are widely applied, improved performances for the LED chips has been required. The improved performances mean an improved efficiency and luminance. The HVPE method is well known as a method of obtaining a self-supporting substrate of gallium nitride. Among them, as methods of obtaining crystals of a high quality, the DEEP method (patent document 1 and non-patent document 1) and VAS method (patent documents 2 and 3) are disclosed.

The flux method is a kind of liquid phase method. In the case of gallium nitride, by using sodium metal as a flux, it is possible to reduce the temperature and pressure required for the crystal growth of gallium nitride to about 800° C. and several MPa, respectively. Specifically, nitrogen gas is dissolved into a mixed melt of sodium metal and gallium metal, so that gallium nitride becomes in a supersaturated state and grows as a crystal. According to such a liquid phase process, dislocations are reduced more than that in the case of a vapor phase process, so that it is possible to obtain gallium nitride of a high quality and having a lower dislocation density (Patent document 4).

RELATED DOCUMENTS (Non-patent document 1) SEI Technical Review 2009, July, Vol. 175, pages 10 to 18, "Development of GaN Substrates"

(Patent document 1) Japanese patent No. 3801125B1

(Patent document 2) Japanese patent No. 3631724B1

(Patent document 3) Japanese patent No. 4396816B1

(Patent document 4) Japanese patent publication No. 2009-012986A

SUMMARY OF THE INVENTION

It is necessary to make the conductivity of a nitride crystal layer of a group 13 element high, for producing LED's and laser diodes. For this, the inventors have tried to dope a dopant, such as Si or oxygen, into the crystal layer, so that the conductivity of the crystal layer and its output power are improved.

However, even if the conductivity of the crystal layer is actually increased, there were cases that an output power of the emitted light was not improved, in the case of a so-called vertical type light-emitting device and that its current was raised, for example.

An object of the present invention is, in a substrate of a crystal of a nitride of a group 13 element, to obtain a desired conductivity and to effectively utilize the conductivity of the crystal of the nitride of the group 13 element to improve its function.

The present invention provides a crystal substrate comprising an underlying layer and a thick layer:

the underlying layer comprising a crystal of a nitride of a group 13 element and having a first main face and a second main face;

the thick film comprising a crystal of a nitride of a group 13 element provided over the first main face of the underlying layer;

wherein the underlying layer comprises a low carrier concentration region and a high carrier concentration region, both concentration regions extending between the first main face and the second main face;

wherein the low carrier concentration region has a carrier concentration of $10^{17}/cm^3$ or lower;

wherein the low carrier concentration region has a defect density of $10^7/cm^2$ or lower;

wherein the high carrier concentration region has a carrier concentration of $10^{19}/cm^3$ or higher;

wherein the high carrier concentration region has a defect density of $10^8/cm^2$ or higher;

wherein the thick film has a carrier concentration of $10^{18}/cm^3$ or higher and $10^{19}/cm^3$ or lower; and wherein the thick film has a defect density of $10^7/cm^2$ or lower.

The present invention further provides a device comprising:

the crystal substrate; and a functional layer comprising a nitride of a group 13 element formed over the crystal substrate.

Effects of the Invention

For example, in the case that LED's or laser diodes of vertical type structures are produced, a high conductivity is required. However, for providing the conductivity by doping a dopant, such as Si or oxygen, into a crystal of the nitride of a group 13 element, it is proven that it is difficult to dope the dopant uniformly over the whole surface of a wafer. It is further proven that the crystallinity deteriorates and the dislocation density increases in regions where the content of the dopant is higher.

Then, as the mechanism of the current leakage is considered in detail, the following was found. That is, in a cross-sectional structure of the crystal substrate of the nitride of the group 13 element, the crystallinity deteriorates and a current easily flows in a region having a high conductivity. This results in the local concentration of current so that current leakage occurs. That is, it was successfully confirmed that the temperatures of the locations where the current leakage occurred were raised, by observing the cross-section by microscopic thermography.

The following was further confirmed. That is, in the cross-sectional structure of the crystal substrate, the number of defects is large and the current leakage tends to occur in the relatively high carrier concentration region. In addition to this, it was confirmed that the pillar-shaped high carrier concentration region was elongated between the upper and bottom faces of the crystal substrate to penetrate through the substrate. At the same time, it was also confirmed that the low carrier concentration region was elongated in a pillar shape between the upper and bottom faces of the crystal substrate to penetrate through the substrate. It means that the current concentration is likely to occur through the high carrier concentration regions.

Further, a reduction of the luminous efficiency in the case of raising the current density applied onto an LED chip has been known as an efficiency droop phenomenon. Its cause was reported to be carrier overflow, non-radiative recombination, Auger recombination or the like. However, such a phenomenon is mainly found in horizontal type LED's.

The above phenomenon found by the inventors is different from the efficiency droop phenomenon, has not been reported until now and is newly discovered by the inventors. The local current concentration is newly discovered based on the observation as described above.

Based on the discovery, the inventors tried to re-grow a crystal of a nitride of a group 13 element on an underlying layer of a nitride of a group 13 element to form a thick film and to facilitate the association of defects in the thick film by controlling the growth conditions of it. As a result, it is confirmed that the pillar-shaped high carrier concentration regions in the crystal substrate are dispersed in the thick film so that the carriers are dispersed uniformly to realize a relatively uniform luminescence in CL. It is thus possible to successfully prevent the current leakage between a pair of the main faces of the crystal substrate by providing the thick film having such a cross-sectional structure on the underlying layer. It is thus possible to prevent current leakage in the case that the voltage applied on the crystal substrate is raised, so that the conductivity of the crystal substrate can be effectively utilized and the function can be further improved.

EMBODIMENTS FOR CARRYING OUT THE INVENTION

The present invention will be described further in detail, appropriately referring to the attached drawings.

(Crystal substrate)

Figure 1A:
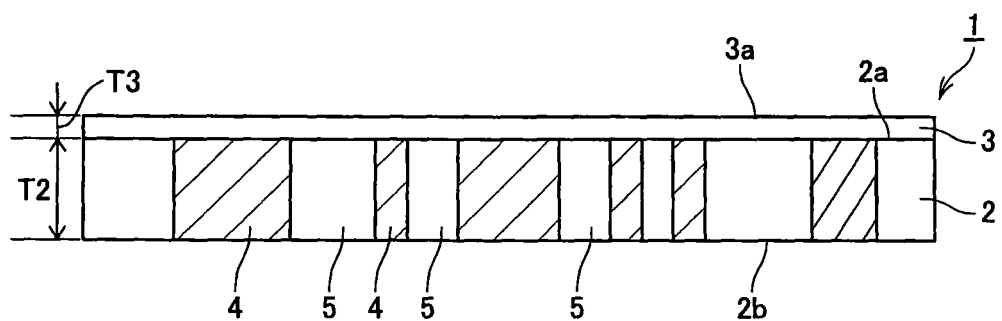
FIG. 1(a) is a view schematically showing a crystal substrate 1 according to an embodiment of the present invention.

According to a preferred embodiment, as shown in FIG. 1(a), a thick film 3 composed of a nitride of a group 13 element is formed on an underlying layer 2 composed of a nitride of a group 13 element. The underlying layer 2 includes a first main face 2a and a second main face 2b. The thick film 3 is provided on the first main face 2a of the underlying layer 2.

The underlying layer 2 includes low carrier concentration regions 5 and high carrier concentration regions 4, each extending between the first main face 2a and the second main face 2b. It is confirmed that each of the regions 4 and 5 is generated to extend through the underlying layer 2 between the first and second main faces.

Here, the low carrier concentration region 5 has a carrier concentration of $10^{17}/cm^3$ or lower, and the low carrier concentration region 5 has a defect density of $10^7/cm^2$ or lower. Further, the high carrier concentration region 4 has a carrier concentration of $10^{19}/cm^3$ or higher, and the high carrier concentration region 4 has a defect density of $10^8/cm^2$ or higher. According to the mechanism described above, the dopants are concentrated in the high carrier concentration region so that its carrier concentration is raised, and defects are also concentrated into the same region, which is elongated to extend between the main faces of the underlying layer.

Here, the low carrier concentration region may preferably have a carrier concentration of $8 \times 10^{16}/cm^3$ or lower. Further, in the underlying layer including the high carrier concentration region described above, the carrier concentration of the low carrier concentration region may be $1 \times 10^{17}/cm^3$ or lower and $1 \times 10^{16}/cm^3$ or higher in many cases. Further, the defect density of the low carrier concentration region may preferably be $8 \times 10^6/cm^2$ or lower. Further, the defect density of the low carrier concentration region may be $2 \times 10^6/cm^2$ or higher in many cases.

Further, the carrier concentration of the high carrier concentration region 4 is $10^{19}/cm^3$ or higher and may preferably be $2 \times 10^{19}/cm^3$ or higher. Further, in the underlying layer including the low carrier concentration region described above, the carrier concentration of the high carrier concentration region may be $5 \times 10^{19}/cm^3$ or lower in many cases. Further, the defect density of the high carrier concentration region may preferably be $5 \times 10^7/cm^2$ or lower.

According to the present invention, the carrier concentration of the thick film 3 is $10^{18}/cm^3$ or higher and $10^{19}/cm^3$ or lower, and the defect density of the thick film is $10^7/cm^2$ or lower. Although the defect density of the thick film is preferably lower, as the thick film is provided on the underlying layer of the structure described above, the defect density of the thick film is $2 \times 10^6/cm^2$ or higher in many cases.

Here, in the case that the dopant is an n-type dopant (such as Si, Ge, oxygen or the like), the activation ratio is as high as 98 percent or higher, so that the dopant concentration can be deemed as the carrier concentration. The carrier concentration will be described below from the viewpoint of the present invention for preventing leakage due to the current concentration. However, the activation ratio can be deemed as 100 percent and the carrier concentration can be read as the dopant concentration.

According to the present invention, the high carrier concentration region and low carrier concentration region are measured and distinguished as follows.

A system of measuring cathode luminescence (for example, MP series supplied by HORIBA, Ltd.) at a magnitude of 50 to 500 fold and in a rectangular region of taking an image of 0.1 mm and 1 mm.

The carrier concentration and defect density are to be measured according to the method and conditions described in the Examples section.

The group 13 element constituting the underlying layer and thick film is a group 13 element according to the Periodic Table determined by IUPAC. The group 13 element is specifically gallium, aluminum, indium, thallium or the like. The nitride of the group 13 element may preferably be gallium nitride, aluminum nitride or gallium aluminum nitride. Further, as an additive, carbon, a metal having a low melting point (tin, bismuth, silver, gold), and a metal having a high melting point (a transition metal such as iron, manganese, titanium, chromium) may be listed.

It is necessary, in the thick film, to associate the defects so as to prevent the high carrier concentration regions from penetrating through the thick film to the surface of the thick film. From this viewpoint, the thickness T3 of the thick film may preferably be 1 μm or larger, more preferably be 50 μm or larger and most preferably be 100 μm or larger. Further, as the thickness T3 of the thick film becomes too large, the conductivity as a whole becomes lower. The thickness of the thick film may preferably be 300 μm or smaller and more preferably be 200 μm or smaller.

The thickness T2 of the underlying film may preferably be 50 μm or smaller, from the viewpoint of ease of handling. Further, the thickness of the underlying film may preferably be 200 μm or smaller, from the viewpoint of conductivity.

Further the total thickness (T2+T3) of the crystal substrate, that is, of the underlying layer and thick film may preferably be 250 to 450 μm.

(Functional Layer and Functional Device)

A functional layer may be formed on the thick film to obtain a functional device.

The functional layer as described above may be composed of a single layer or a plurality of layers. Further, as the functions, it may be used as a white LED with a high brightness and improved color rendering index, a blue-violet laser disk for a high-speed and high-density optical memory, or a power device for an inverter for a hybrid car or the like.

As a semiconductor light-emitting diode (LED) is produced on the crystal substrate by a vapor phase process, preferably by the metal organic vapor phase deposition (MOCVD) method, the dislocation density inside of the LED can be made comparable with that of the thick film of the crystal substrate.

The film-forming temperature of the functional layer may preferably be 950° C. or higher, and more preferably be 1000° C. or higher, from the viewpoint of inhibiting the incorporation of impurities such as carbon. Further, from the viewpoint of preventing defects, the film-forming temperature of the functional layer may preferably be 1200° C. or lower and more preferably be 1150° C. or lower.

The material of the functional layer may preferably be a nitride of a group 13 element. A group 13 element means a group 13 element according to the Periodic Table determined by IUPAC. The group 13 element is specifically gallium, aluminum, indium, thallium or the like.

Figure 1B:
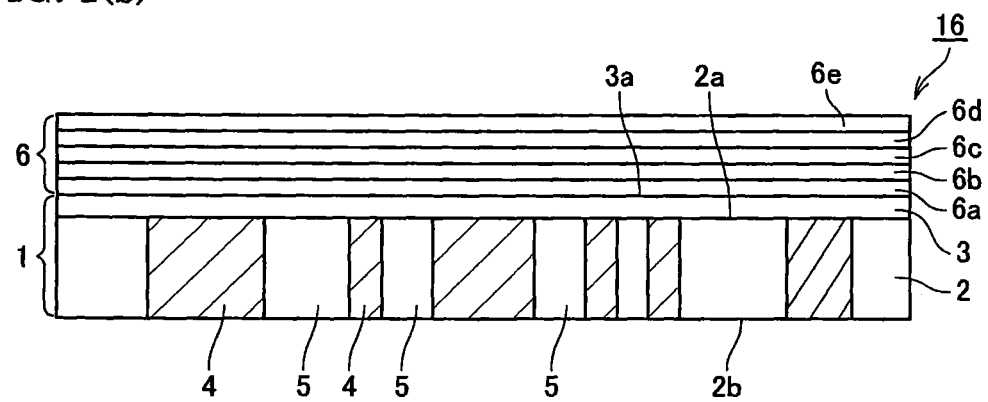
FIG. 1(b) is a view schematically showing a functional device 16 with the substrate 1 and a functional device structure 6 formed thereon.

The light-emitting device structure includes, an n-type semiconductor layer, a light-emitting region provided on the n-type semiconductor layer and a p-type semiconductor layer provided on the light-emitting region, for example. In a light-emitting device 16 shown in FIG. 1(b), an n-type contact layer 6a, n-type clad layer 6b, active layer 6c, p-type clad layer 6d and p-type contact layer 6e are formed on the thick film 3 of the crystal substrate to constitute the light-emitting structure 6.

Further, the light-emitting structure described above may preferably further include an electrode for the n-type semiconductor layer, an electrode for the p-type semiconductor layer, a conductive adhesive layer, a buffer layer and a conductive supporting body or the like not shown.

According to the light-emitting structure, as light is emitted in the light-emitting region through re-combination of holes and electrons injected through the semiconductor layers, the light is drawn through the side of a translucent electrode on the p-type semiconductor layer or the film of the nitride single crystal of the group 13 element. Besides, the translucent electrode means an electrode capable of transmitting light and made of a metal thin film or transparent conductive film formed substantially over the whole of the p-type semiconductor layer.

The n-type semiconductor layer or p-type semiconductor layer is composed of a semiconductor of a III-V group compound semiconductor, which includes the following.

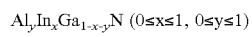

$Al_yIn_xGa_{1-x-y}N$ (0≤x≤1, 0≤y≤1)

As a dopant for imparting n-type conductivity, silicon, germanium and oxygen are listed. Further, as a dopant for imparting a p-type conductivity, magnesium and zinc are listed.

The method of growing each of the semiconductor layers constituting the light-emitting structure includes various kinds of vapor phase growing methods. For example, metal organic chemical vapor deposition (MOCVD; MOVPE), molecular beam epitaxy (MBE), hydride vapor phase epitaxy (HVPE) or the like may be used. Among them, it is possible to obtain semiconductor layers with a good crystallinity and flatness by the MOCVD method. According to the MOCVD method, an alkyl metal compound such as TMG (trimethyl gallium) and TEG (triethyl gallium) or the like is used as the Ga source in many cases and a gas such as ammonia and hydrazine are used as the nitrogen source.

The light-emitting region includes a quantum well active layer. The material of the quantum well active layer is designed so that the band gap is made smaller than those of the n-type and p-type semiconductor layers. The quantum well active layer may be a single quantum well active layer (SQW) structure or a multi quantum well active layer (MQW) structure. The material of the quantum well active layer includes the followings.

As a preferred example of the quantum well active layer, an MQW structure including three to ten periods of quantum well active layers each made of $Al_xGa_{1-x}N/Al_yGa_{1-y}N$ (x=0.15, y=0.20) series with a film thickness of 3 nm/8 nm is listed.

(Production of Crystal Layer)

According to a preferred embodiment, the underlying layer and thick film are formed on a seed crystal in this order. The seed crystal may form a self-supporting substrate (supporting body) or may be a seed crystal film formed on a separate supporting body. The seed crystal film may be composed of a single layer or may include a buffer layer on the side of the supporting body.

Figure 2A:
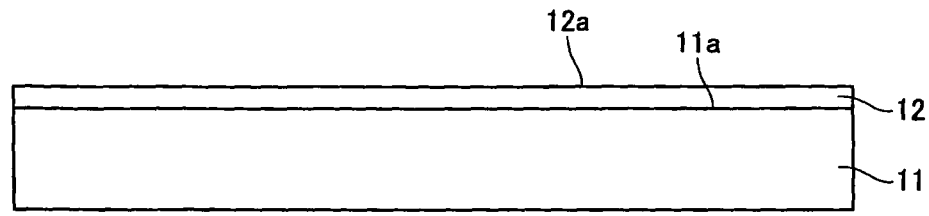
FIG. 2(a) shows the state that a seed crystal film 12 is provided on a supporting body 11, FIG. 2 (b) shows the state that an underlying film 13 composed of a crystal of a nitride of a group 13 element is provided on the seed crystal film 12.

For example, as shown in FIG. 2(a), a seed crystal film 12 is formed on a surface 11a of a supporting body 11. The seed crystal film 12 is composed of a nitride of a group 13 element.

In the case that the seed crystal film is formed on the supporting body, although the single crystal forming the supporting body is not limited, it includes sapphire, an AlN template, GaN template, self-supporting GaN substrate, silicon single crystal, SiC single crystal, MgO single crystal, spinel ($MgAl_2O_4$), $LiAlO_2$, $LiGaO_2$, and perovskite composite oxide such as $LaAlO_3$, $LaGaO_3$ or $NdGaO_3$ and SCAM ($ScAlMgO_4$). A cubic perovskite composite oxide represented by the composition formula $[A_{1-y}(Sr_{1-x}Ba_x)_y][(Al_{1-z}Ga_z)_{1-u}D_u]O_3$ (wherein A is a rare earth element; D is one or more element selected from the group consisting of niobium and tantalum; y=0.3 to 0.98; x=0 to 1; z=0 to 1; u=0.15 to 0.49; and x+z=0.1 to 2) may be also used.

The direction of growth of the nitride crystal layer of the group 13 element may be a direction normal to a c-plane of the wurtzite structure or a direction normal to each of the a-plane and m-plane.

The dislocation density at the surface 12a of the seed crystal is preferably lower, from the viewpoint of reducing the dislocation density of the crystal substrate provided on the seed crystal. From this viewpoint, the dislocation density at the surface 12a of the seed crystal layer may preferably be $7\times10^8$ cm$^{-2}$ or lower and more preferably be $5\times10^8$ cm$^{-2}$ or lower. Further, as the dislocation density of the seed crystal may preferably be lower from the viewpoint of quality, the lower limit is not particularly provided, but it may generally be $5\times10^7$ cm$^{-2}$ or higher in many cases.

The method of forming the seed crystal film is not particularly limited, and a vapor phase process such as a metal organic chemical vapor deposition (MOCVD) method, hydride vapor phase epitaxy (HVPE) method, pulse-excited deposition (PXD) method, MBE method and sublimation method, and a liquid phase process such as a flux method are exemplified.

Figure 2B:
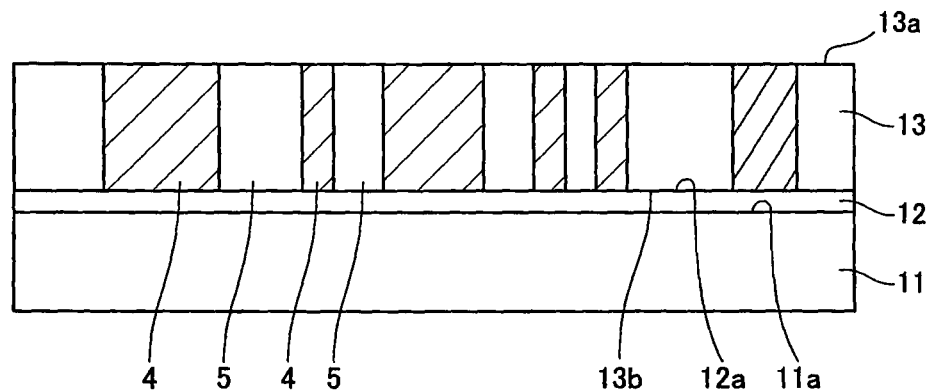
FIG. 2(c) shows the state that a thick film 14 is formed on the underlying film 13.
Figure 2C:
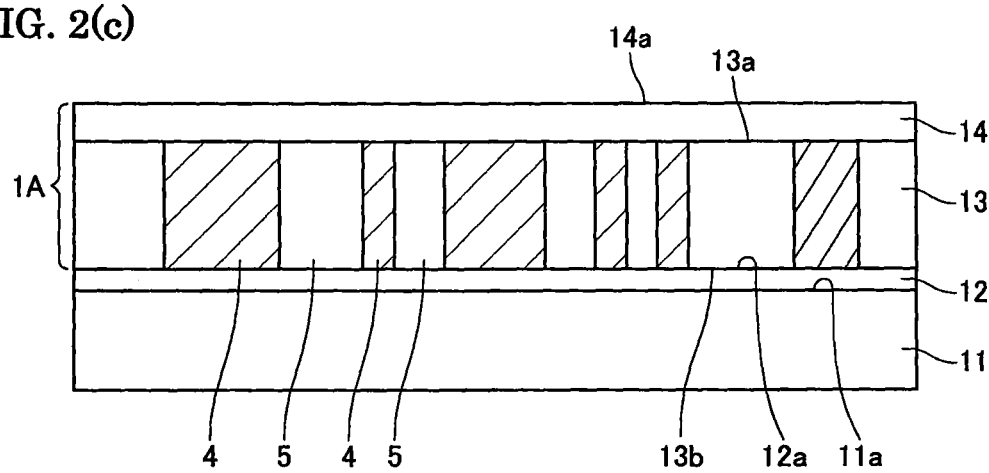

Then, as shown in FIG. 2(b), the underlying layer 13 is formed on the seed crystal film 12. Then, as shown in FIG. 2(c), the thick film 14 is formed on the surface 13a of the underlying layer 13.

According to a preferred embodiment, the underlying layer and thick film are grown by a flux method. In this case, the kind of flux is not particularly limited, as far as it is possible to grow the nitride of the group 13 element. According to a preferred embodiment, a flux is used containing at least one of an alkali metal and alkaline earth metal, and a flux containing sodium metal is particularly preferred.

A raw material of the nitride of the group 13 element is mixed with the flux and used. As the raw material, a single metal, an alloy and a compound are applicable, and the single metal of the group 13 element is suitably used from the viewpoint of handling.

In the case that the underlying layer is produced by a flux method, for promoting the vertical growth, the supersaturation degree is held at a low value and the flow of the melt is reduced, so that only the concentration gradient is utilized as the driving force for growing the crystal. The nucleation is restrained and the crystal is grown upwardly from nuclei 20 (arrows C) as shown in FIG. 3(b).

Specifically, the underlying layer is preferably grown according to the following method.
(1A) The average growth temperature of the melt in the crucible is made high, so that the supersaturation degree is increased to inhibit the formation of nuclei 20 (Refer to FIG. 3(a)).
(2A) The temperature at an upper part of the crucible is made higher than that at a bottom part of the crucible so that flow of the melt is inhibited.
(3A) The melt is not agitated, or its agitation rate is made lower if agitated.
(4A) The partial pressure of a nitrogen-containing gas is made lower.

For example, the following conditions are applicable.
(1A) The average growth temperature of the melt in the crucible is 870 to 885° C.
(2A) The temperature at the upper part in the crucible is made higher than that at the bottom part of the crucible by 0.5 to 1° C.
(3A) The melt is not agitated, or the agitation rate is made 30 rpm or smaller. Further, the direction of the agitation is fixed.
(4A) The partial pressure of the nitrogen-containing gas is 3.5 to 3.8 MPa.

Under such conditions, a large number of crystal defects is present in the high carrier concentration regions. This is because, according to the structure of crystals grown upwardly and vertically in a shape of a pillar, the number of the carriers and crystal defects tend to increase in the sites with many dopants.

The crystal defects referred to herein means threading dislocations, including three kinds of dislocations: screw dislocations, edge dislocations and mixed dislocations. These kinds of dislocations can be confirmed by a transmission type electron microscope (TEM) or cathode luminescence (CL).

Then, a nitride of a group 13 element is re-grown in the same melt by a flux method so that the thick film as described above can be formed.

That is, the growth conditions are changed to increase the crystal growth rate. As a result, as shown in FIG. 3(b), the crystal growth 21 is mainly constituted by lateral growth (arrows A and B).

During the stage of forming the thick film, the following modifications are preferred.
(1B) The average growth temperature of the melt in the crucible is 850 to 860° C. Further, a difference between the average growth temperature and that in the initial stage is 10 to 25° C.
(3B) The melt is agitated, and the direction of the agitation is periodically changed. Further, the rotation of the crucible is stopped when the direction of the rotation is changed. In this case, the time period of the stopping the rotation may preferably be 100 to 6000 seconds and more preferably be 600 to 3600 seconds. Further, the time periods of the rotation before and after stopping the rotation may preferably be 10 to 600 seconds and the rotational rate may preferably be 10 to 30 rpm.
(4B) The partial pressure of the nitrogen-containing gas is 4.0 to 4.2 MPa, and the partial pressure is made higher than the partial pressure of the nitrogen-containing gas in the initial state by 0.2 to 0.5 MPa.

Here, preferably, in the stage of forming the thick film, the production conditions are gradually changed so that the low-dislocation density and carrier concentration are balanced. Specifically, the agitation rate of the melt is gradually elevated, and the retention time at the maximum rotational rate during the agitation is made gradually longer.

The crystal defects are thereby elongated from the lower main face contacting the underlying layer to the surface as the crystal is grown, while they are associated with each other. The carrier concentration and defect density are thus uniformly distributed in the thick film so that the concentration of the leak current can be prevented.

According to the flux method, a single crystal is grown in an atmosphere containing a nitrogen atom-containing gas.

For this gas, nitrogen gas may be preferably used, and ammonia may be used. Any other gas except the nitrogen atom-containing gas in the atmosphere is not limited; but an inert gas may be preferably used, and argon, helium, or neon may be particularly preferred.

It is preferred to hold for one hour or longer, more preferably two hours or longer, under the conditions (1A) to (4A) as described above, in the stage of growing the underlying layer. The retention time in the stage of forming the underlying layer may preferably be 10 hours or shorter.

A ratio (molar ratio) of the nitride of the group 13 element/flux (for example, sodium) in the melt may preferably be made higher, preferably be 18 mol % or higher and more preferably be made 25 mol % or higher, from the viewpoint of the present invention. However, as this ratio becomes too high, the crystal quality tends to deteriorate, so that the ratio may preferably be 40 mol % or lower.

(Vapor Phase Method)

Figure 3A:
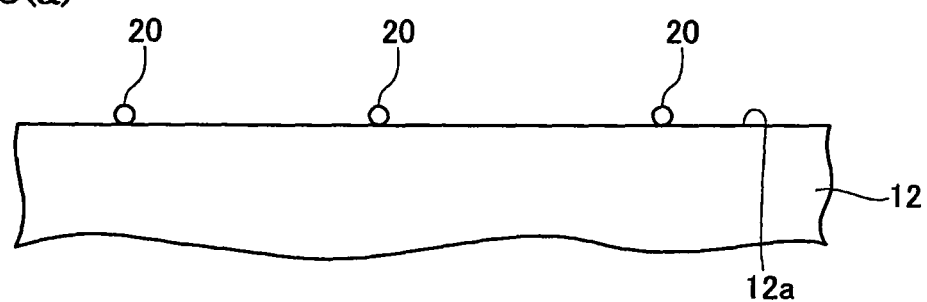
FIG. 3(a) is a view schematically showing nuclei 20 generated on the seed crystal 12.
Figure 3B:
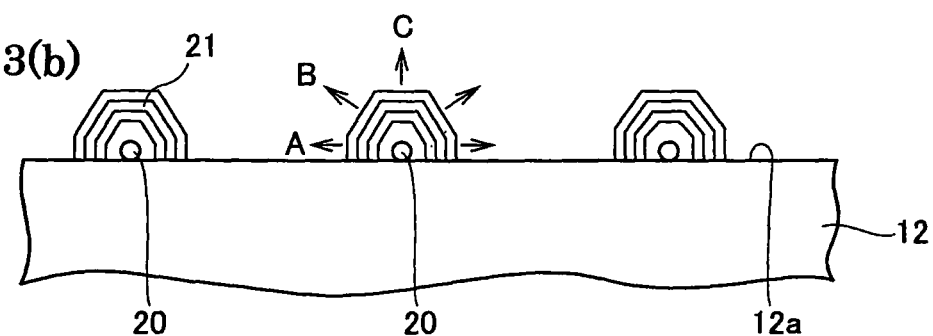
FIG. 3(b) is a view schematically showing the directions of growth from the nuclei 20.

For example, in the case of an HVPE method, in an initial stage of the growth, the mixed ratio of hydrogen is made higher (for example 50 percent or higher) so that the growth rate is made lower (for example, 10 to 20 microns/hr) and the crystal is grown primarily in the direction shown by arrow C in FIGS. 3(a) and 3(b). Thereafter, the mixed ratio of hydrogen is lowered (for example 30 percent or lower) and the ratio of V/III is made higher (for example 2000 or higher) so as to realize growth primarily in the directions shown by arrows A and B in FIG. 3(b).

The nitride of the group 13 element grown by a flux method emits a fluorescence (blue fluorescence) having a broad peak in a wavelength of 440 to 470 nm, in the case that it is irradiated light of a wavelength of 330 to 385 nm (for example light emitted from a mercury lamp). On the other hand, the nitride of the group 13 element produced by a vapor phase process emits a fluorescence (yellow fluorescence) having a broad peak in a wavelength of 540 to 580 nm, in the case that it is irradiated light of a wavelength of 330 to 385 nm. It is thereby possible to distinguish the nitride crystals of the group 13 element obtained by a flux method and a vapor phase process, based on the color of the fluorescence emitted by irradiating the light of a wavelength of 330 to 385 nm.

(Processing and Shape of Crystal Layer)

Figure 4A:
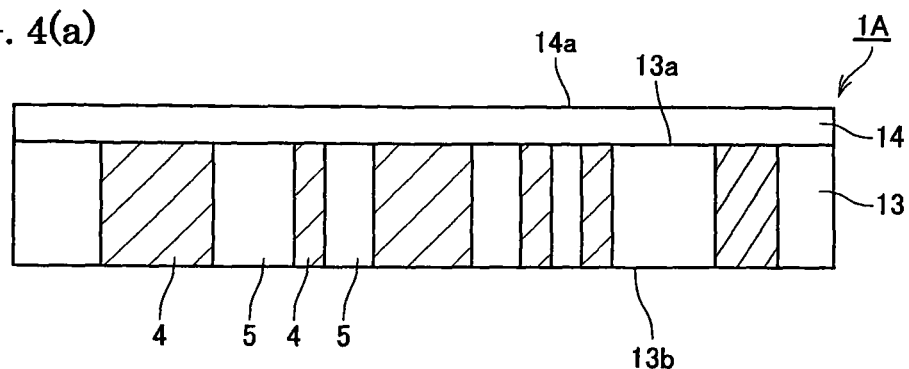
FIG. 4(a) shows the state that the underlying layer 13 and thick film 14 are separated from the seed crystal film.

As shown in FIGS. 2(b) and 2(c), the crystal substrate 1A is formed on the seed crystal film, and then a specific functional layer may be formed on the surface 14a of the thick film 14. Alternatively, the crystal substrate 1A may be removed from the seed crystal 12 by grinding, lift-of or the like to separate the crystal substrate 1A as shown in FIG. 4(a). In this case, the specific functional layer is formed on the thick film 14 of the separated crystal substrate 1A. At this time, the bottom face 13b of the underlying layer 13 may be subjected to polishing to reduce the warpage of the crystal substrate.

Figure 4B:
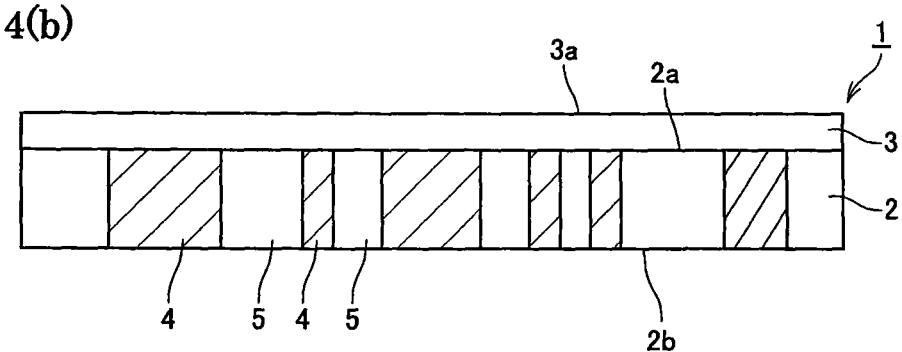
FIG. 4(b) shows a crystal substrate 1 obtained by processing the underlying layer 13 and thick film 14 of FIG. 4(a).

Alternatively, the surface 14a of the thick film 14 may be polished to make the surface 3a of the thick film 3 a polished surface as shown in FIG. 4(b). Further, at this time, the bottom face 13b of the underlying layer 13 may be subjected to polishing to make the bottom face 2a of the underlying layer 2 a polished surface as shown in FIG. 4(b).

According to a preferred embodiment, the layer of the crystal of the nitride of the group 13 element has a shape of a circular plate, and it may have another shape such as a rectangular plate. Further, according to a preferred embodiment, the dimension of the gallium nitride substrate is of a diameter φ of 25 mm or larger. It is thereby possible to provide a crystal layer which is suitable for the mass production of functional devices and easy to handle.

It will be described below the cases of grinding and polishing the surfaces of the crystal substrate of the nitride of the group 13 element.

Grinding is when an object is contacted with fixed abrasives, obtained by fixing the abrasives by a bond and rotating at a high rotation rate, to grind a surface of the object. By such grinding, a roughened surface is formed. In the case that a bottom face of the gallium nitride substrate is ground, fixed abrasives containing abrasives composed of SiC, $Al_2O_3$, diamond, CBN (cubic boron nitride, same applies below) or the like having a high hardness and having a grain size of about
10 µm to 100 µm are preferably used.

Further, lapping is when a surface plate and an object are contacted while they are rotated with respect to each other, through free abrasives (it means abrasives which are not fixed, same applies below) or fixed abrasives, to polish a surface of the object. By such lapping, a surface is formed having a surface roughness smaller than that in the case of the grinding and larger than that in the case of micro lapping (polishing). Abrasives are preferably used composed of SiC. $Al_2O_3$, diamond, CBN or the like having a high hardness and having a grain size of about 0.5 µm or larger and 15 µm or smaller.

Micro lapping (polishing) means that a polishing pad and an object are contacted with each other through free abrasives while they are rotated with respect to each other, or fixed abrasives and the object are contacted with each other while they are rotated with respect to each other, for subjecting a surface of the object to micro lapping to flatten it. By such polishing, it is possible to obtain a crystal growth surface having a surface roughness smaller than that in the case of lapping.

EXAMPLES

Example

The crystal substrate and light emitting device were produced, according to the procedure described referring to FIGS. 1 to 4.

(Production of a Seed Crystal Substrate)

A low-temperature GaN buffer layer was deposited of 20 nm at 530° C. using an MOCVD method, on a c-plane sapphire substrate 11 having a diameter of 2 inches and a thickness of 500 µm. A seed crystal film 12 made of GaN and having a thickness of 2 µm was deposited thereon at 1050° C. The defect density observed by TEM (transmission type electron microscope) was proved to be $1 \times 10^9/cm^2$. The obtained assembly was subjected to ultrasonic washing with an organic solvent and ultra-pure water for 10 minutes, respectively, and then dried to obtain a seed crystal substrate.

(Growth of Underlying Layer)

In a glove box filled with an inert gas, Ga metal and Na metal were weighed in a molar ratio of 20:80 and then placed on a bottom of an alumina crucible with the seed crystal substrate. Further, as a dopant, liquid germanium was added thereto in an amount of 1 mol/cm³ with respect to Ga. Three crucibles were stacked, and an alumina lid was mounted on the top of the three crucibles. These were contained in a holding container (reaction container) of stainless steel. Four reaction containers, each containing the stack of the crucibles, were stacked and then contained in a holding container (inner container) made of stainless steel.

Then, heaters provided in a pressure container were heated to melt raw materials in the crucibles to generate Ga—Na mixed melts. While the crucibles were heated to maintain the temperature at 880° C., nitrogen gas was supplied from a nitrogen gas bombe until a pressure of 4.0 MPa to initiate the crystal growth. Five hours later, the temperature in the crucible was lowered to 850° C. over 20 hours and the pressure was changed to 4.2 MPa. At this time, agitation was initiated by inverting the rotational direction of the rotational table continuously to change the growth mode of the crystal. Thereafter, the pressure was changed to 4.0 MPa for 30 minutes and the agitation was continued by inverting the rotational direction of the rotational table continuously to grow the crystal.

As to the conditions of the rotation, the rotational table was rotated around a central axis at a rate of 20 rpm clockwise and anti-clockwise at a specific interval. The time period for acceleration was 6 seconds, the holding time was 200 seconds, the rate-decreasing time was 6 seconds and the stopping time was 1 second. Such a condition was held for 24 hours. The thickness of the GaN crystal was increased by about 300 microns.

The surface of the thus obtained gallium nitride crystal substrate was subjected to polishing to make the thickness 250 microns. The density of dark spots on the surface was measured by cathode luminescence and proved to be $2\times10^5/cm^2$. The density of the dark spots was deemed as the defect density. A sample was cut out from the crystal substrate in the dimensions of 6 mm×6 mm, and the samples was subjected to hole measurement to obtain the carrier density, which was $5\times10^{18}/cm^3$.

(Growth of Thick Film)

Then, n-GaN was further grown of 100 microns using the liquid phase process. N-type dopants were doped so that the carrier density was made $1\times10^{18}/cm^3$.

As to the growth conditions, the rotational rate as described above was gradually increased from 20 rpm to 40 rpm over 4 hours, and the retention time at 35 rpm was increased from 200 seconds to 600 seconds stepwise by 100 seconds over 4 hours. Thereafter, the crystal was cooled to room temperature and collected. The crystal of about 100 microns was grown for a total time of 8 hours.

(Production of a Wafer)

Thereafter, the substrate was subjected to laser lift-off so that the supporting substrate and seed crystal film were separated from the gallium nitride crystal substrate. Both faces of the crystal substrate were subjected to mechanical processing and dry etching to perform the flattening to obtain a 2-inch wafer 1 having a thickness of 290 μm. The thicknesses of the thick film 3 and underlying layer 2 after the polishing were about 40 microns and 250 microns, respectively.

The cross-sectional structure of the wafer was observed by CL. As a result, the cross-section was divided into brightly light-emitting regions 5 and dark regions 4 in the underlying layer. Each of the regions was grown in a pillar shape in the cross-section. Further, dark lines due to the concentration of dislocations were observed in the central part of the brightly light-emitting region 4. The brightly light-emitting region 4 has a defect density of 2 to $5\times10^8/cm^2$ and a carrier concentration of $1\times10^{19}/cm^3$. The region 5 of a lower luminous intensity has a substantially uniform defect density of $3\times10^6/cm^2$ and a carrier concentration of $8\times10^{16}/cm^3$.

On the other hand, in the thick film 3, uniform luminescence was observed and the dislocation-concentrated regions were not observed. The defect density was approximately uniform and $3\times10^6/m^3$, and the carrier concentration was $1\times10^{18}/cm^3$.

The carrier concentration was measured as follows. CL measurement was carried out for four samples whose carrier concentrations are measured in advance by eddy current system ($1\times10^{17}/cm^3$; $1\times10^{18}/cm^3$; $5\times10^{18}/cm^3$; $1\times10^{19}/cm^3$). The brightness of each of the corresponding images was subjected to image processing in 8 bits (255 gradations) to provide a calibration line concerning the carrier density and brightness of the CL image. The thus obtained calibration line was used to calculate the carrier concentration.

Further, light of a wavelength of 330 to 385 nm was irradiated from a mercury lamp to the thus obtained thick film 3. Fluorescence (blue fluorescence) having a broad peak at 440 to 470 nm was oscillated.

(Production of Light-Emitting Device)

The thus obtained crystal substrate was used to produce an LED structure by the MOCVD method. Electrodes were then patterned and the back face was polished so that the thickness of the underlying layer after the back-polishing was made 70 microns. A blue LED was then produced having dimensions of 1 mm×1 mm by dicing and of the horizontal type structure. The internal quantum efficiency was measured at a driving current of 350 mA and was as high as about 80 percent. The luminous intensity was uniform over the plane. Further, the driving current was raised to 1000 mA and the internal quantum efficiency was measured to prove to be as high as 65 percent. Further, the leak current at an application voltage of 2V was as low as 0.01 ρA.

Comparative Example 1

A crystal substrate was produced according to the same procedure as Example 1 and the LED structure was fabricated thereon. However, different from Example 1, the growth of the crystal was terminated at the stage of forming the underlying layer and the thick film was not formed.

As the cross-section of the underlying layer was observed according to the same procedure as Example 1, brightly light-emitting regions 4 and dark regions 5 were elongated in pillar shape in the direction of growth, respectively, and did not intersect each other. Many black lines, which are considered to be dislocation lines, were observed in the brightly light-emitting regions 4. On the other hand, the black lines were scarcely observed in the dark regions 5. Further, the defect densities and carrier concentrations of the respective regions 4 and 5 were substantially the same as those in Example 1.

The internal quantum efficiency at a driving current of 350 mA was measured for the thus obtained LED device, A relatively high value of about 75 percent was obtained but the light-emitting intensity was not uniform in a plane. Further, it was elevated to 1000 mA and the internal quantum efficiency was measured. It was lowered to 55 percent and the deviation of the light-emitting efficiency became considerable. Further, the leak current at an application of 2V was 1 mA, which was larger than that in Example 1.

According to the experimental results described above, it was proven that the defect concentrated region in the brightly light-emitting regions 4 in the underlying layer was the cause of the leak current.

What is claimed is:

1. A group 13 nitride crystal substrate comprising an underlying layer and a thick layer:

said underlying layer comprising a crystal of a nitride of a group 13 element and having a first main face and a second main face;

said thick film comprising a crystal of a nitride of a group 13 element and provided over said first main face of said underlying layer;

wherein said underlying layer comprises a low carrier concentration region and a high carrier concentration region both extending between said first main face and said second main face;

wherein said low carrier concentration region has a carrier concentration of $1\times10^{16}/cm^3$ or higher and $10^{17}/cm^3$ or lower;

wherein said low carrier concentration region has a defect density of $2\times10^6/cm^2$ or higher and $10^7/cm^2$ or lower;

wherein said high carrier concentration region has a carrier concentration of $10^{19}/cm^3$ or higher and $5\times10^{19}/cm^3$ or lower;

wherein said high carrier concentration region has a defect density of $10^8/cm^2$ or higher and $5\times10^8/cm^2$ or lower;

wherein said thick film has a carrier concentration of $10^{18}/cm^3$ or higher and $10^{19}/cm^3$ or lower; and wherein said thick film has a defect density of $10^7/cm^2$ or lower.

2. The crystal substrate of claim 1, wherein a defect density at a surface of said thick film is $10^7/cm^2$ or lower.

3. The crystal substrate of claim 1, wherein said thick film has a thickness of 1 μm or larger and wherein said underlying layer has a thickness of 50 μm or larger and 200 μm or smaller.

4. The crystal substrate of claim 1, wherein said thick film is formed by a flux method or a vapor phase method.

5. The crystal substrate of claim 1, wherein a surface of said thick film comprises a polished surface.

6. The crystal substrate of claim 1, wherein said crystal of said nitride of said group 13 element forming said underlying layer and said crystal of said nitride of said group 13 element forming said thick film comprises gallium nitride.

7. A functional device comprising said crystal substrate of claim 1 and a functional layer formed over said thick film of said crystal substrate and comprising a nitride of a group 13 element.

8. The functional device of claim 7, wherein said functional layer has a function of emitting a light.

9. The functional device of claim 7, further comprising a seed crystal comprising a nitride of a group 13 element, wherein said crystal substrate is provided over said seed crystal.

10. The crystal substrate of claim 1, further comprising a supporting body and a seed crystal layer on said supporting body, wherein said underlying layer is on said seed crystal layer.

* * * * *